United States Patent [19]
Choi et al.

[11] Patent Number: 5,904,515
[45] Date of Patent: May 18, 1999

[54] METHOD FOR FABRICATING A THIN FILM TRANSISTOR WITH THE SOURCE, DRAIN AND CHANNEL IN A GROOVE IN A DIVIDED GATE

[75] Inventors: Jong Moon Choi, Seoul; Chang Reol Kim, Chungcheongbuk-do, both of Rep. of Korea

[73] Assignee: Goldstar Electron Co., Ltd., Chungchungbuk-do, Rep. of Korea

[21] Appl. No.: 08/744,626

[22] Filed: Nov. 6, 1996

Related U.S. Application Data

[62] Division of application No. 08/379,300, Jan. 27, 1995, Pat. No. 5,612,546.

[51] Int. Cl.⁶ .................................................. H01L 21/70
[52] U.S. Cl. ..................... 438/197; 438/142; 438/149; 257/66; 257/68; 257/70; 257/71
[58] Field of Search ..................................... 437/152, 153, 437/158, 164, 270, 285, 589, FOR 155, FOR 180, FOR 183, FOR 197, FOR 200; 438/142, 149, 197; 257/66, 68, 70, 71, 72

[56] References Cited

U.S. PATENT DOCUMENTS

| | | |
|---|---|---|
| 5,023,196 | 6/1991 | Johnsen et al. ........................... 437/40 |
| 5,053,350 | 10/1991 | Solomon ................................... 437/47 |
| 5,071,782 | 12/1991 | Mori ......................................... 437/48 |
| 5,141,886 | 8/1992 | Mori . |
| 5,317,432 | 5/1994 | Ino ........................................... 359/59 |
| 5,318,663 | 6/1994 | Buti et al. ............................... 156/636 |
| 5,352,916 | 10/1994 | Kiyono et al. ........................... 437/52 |
| 5,508,531 | 4/1996 | Ha . |
| 5,563,077 | 10/1996 | Ha . |
| 5,574,294 | 11/1996 | Shepard . |

FOREIGN PATENT DOCUMENTS 5-275697   10/1993   Japan ..................................... 257/347

*Primary Examiner*—Charles Bowers
*Assistant Examiner*—Martin Sulsky
*Attorney, Agent, or Firm*—Faegre & Benson LLP

[57] ABSTRACT

A structure and fabrication method for a thin film transistor suitable for a SRAM memory cell. The thin film transistor structure includes a gate electrode formed to have a groove, a gate insulation film formed on the gate electrode, a semiconductor layer formed in the groove of the gate electrode, and impurity regions formed on opposite sides of the semiconductor layer. The method for fabricating the thin film transistor includes forming a gate electrode and a gate insulation film successively on an insulating substrate so as to have a groove, forming a semiconductor layer on the gate insulation film at a part of the groove, and forming source/drain impurity regions by selective injection of impurity ions into opposite sides of the semiconductor layer.

3 Claims, 5 Drawing Sheets

METHOD FOR FABRICATING A THIN FILM TRANSISTOR WITH THE SOURCE, DRAIN AND CHANNEL IN A GROOVE IN A DIVIDED GATE

This is a division of U.S. patent application Ser. No. 08/379,300, filed Jan. 27, 1995, and entitled "THIN FILM TRANSISTOR STRUCTURE", now U.S. Pat. No. 5,612,546.

BACKGROUND OF THE INVENTION

Field of the Invention

This invention relates generally to thin film transistors. In particular, the present invention is a structure and fabrication method for a thin film transistor which can be used in an SRAM memory cell.

BACKGROUND OF THE INVENTION

Thin film transistors ("TFTs") are often used in place of load resistors in SRAMs of the type over the 1M class. TFTs are also widely used in liquid crystal displays as switching elements for switching video data signals of the pixel regions.

In a high quality SRAM, a thin film transistor has a reduced and relatively low off current and an increased and relatively high on current. SRAMs with TFTs having these characteristics have reduced power consumption and improved memory capabilities. Based on the foregoing principle, studies for improving the on/off current ratio are actively underway.

A conventional method for improving the on/off current ratio can be described with reference to FIGS. 1(a)–1(d). Illustrated in FIGS. 1(a)–1(d) are sections of a conventional fabricating process for a thin film transistor. This process uses a bottom gate as a nucleus and results in the growth of larger grain sizes based on solid state grain growth of the silicon body. The grain is grown by heat treatment at about 600 deg. C. for a relatively long period of time, such as 24 hours.

As shown in FIG. 1(a), a gate electrode 2 is formed by depositing polysilicon on an insulating substrate 1 or on an insulating film, and patterning the polysilicon with a photoetching process using a gate mask. Then, as shown in FIG. 1(b), a layer of gate insulation film 3 and a body of polysilicon 4 are deposited successively over the surface of the gate electrode 2 and the substrate 1 using a chemical vapor deposition method. Thereafter, the grain size of the polysilicon body is grown larger using the solid state grain growth method by heat treating the polysilicon body at about 600 deg. C. for a relatively long time, such as about 24 hours.

As shown in FIG. 1(c), the channel region is masked by depositing a photosensitive film 5 on the body of polysilicon 4 and carrying out exposure and development processes. The channel region is masked and formed so that the source region 6a overlaps the gate electrode 2, and the drain region 6b is offset with respect to the gate electrode 2. Then, as shown in FIG. 1(d), by injecting P-type impurity ions e.g., (BF$_2$), into the exposed body of polysilicon 4, and forming source/drain regions 6a and 6b, a conventional P-type MOS thin film transistor can be completed. The various regions of the transistor shown in FIG. 1(d) are indicated by the following relation: a: source region, b: channel region, c: drain region.

However, the conventional thin film transistor described above has a number of deficiencies. First, the definition of the channel region together with the offset region using the photomask process complicates the process, makes reproduction difficult and greatly increases variation of the off current depending on degree of the alignment. The reliability of the thin film transistor is thereby degraded.

Second, since the position of the channel is relatively far from the gate electrode, the channel may not be completely cut off or inverted. Leakage current can therefore occur, reducing the on current.

Third, because the channel of the thin film transistor has a planar arrangement, if the cell size becomes smaller, the length of the channel also becomes shorter. This shorter channel results in increased leakage current, and thereby limits the level of integration that can be obtained.

SUMMARY OF THE INVENTION

An object of this invention is to solve the foregoing problems and provide a thin film transistor which can be made by a simplified process and incorporated into an SRAM memory element, while reducing the off current and increasing the on current.

These and other objects and features of this invention can be achieved by providing a thin film transistor structure including a gate electrode formed to have a groove, a gate insulation film formed on the gate electrode, a semiconductor layer formed in the groove of the gate electrode, and impurity regions formed at both sides of the semiconductor layer. These and other objects and features of this invention can also be achieved by providing a method for fabricating a thin film transistor including a process for forming a gate electrode and a gate insulation film successively on an insulating substrate so as to have a groove, a process for forming a semiconductor layer on the gate insulation film at a part of the groove, and a process for forming source/drain impurity regions by selective injection of impurity ions into parts at both sides of the semiconductor layer.

DETAILED DESCRIPTION OF THE INVENTION

Figure 1A:
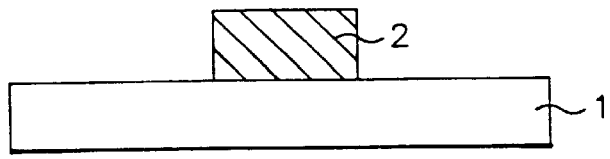
FIGS. 1(a)–1(d) are sectional views showing a conventional process for fabricating a thin film transistor.
Figure 1B:
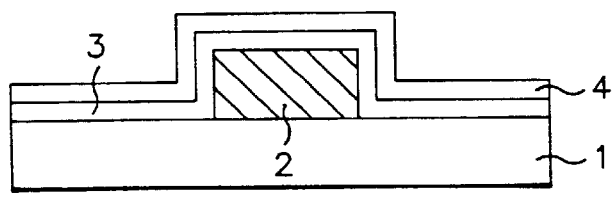
Figure 1C:
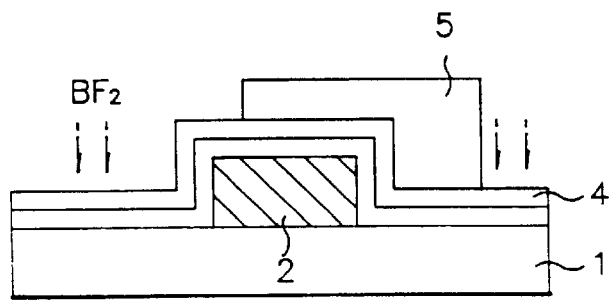
Figure 1D:
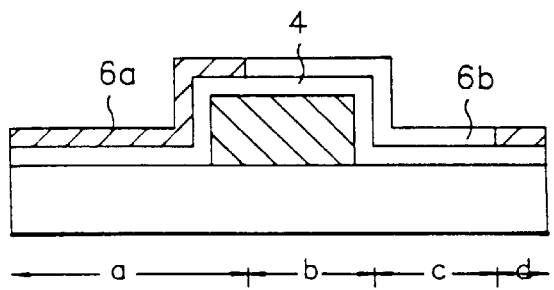
Figure 2:
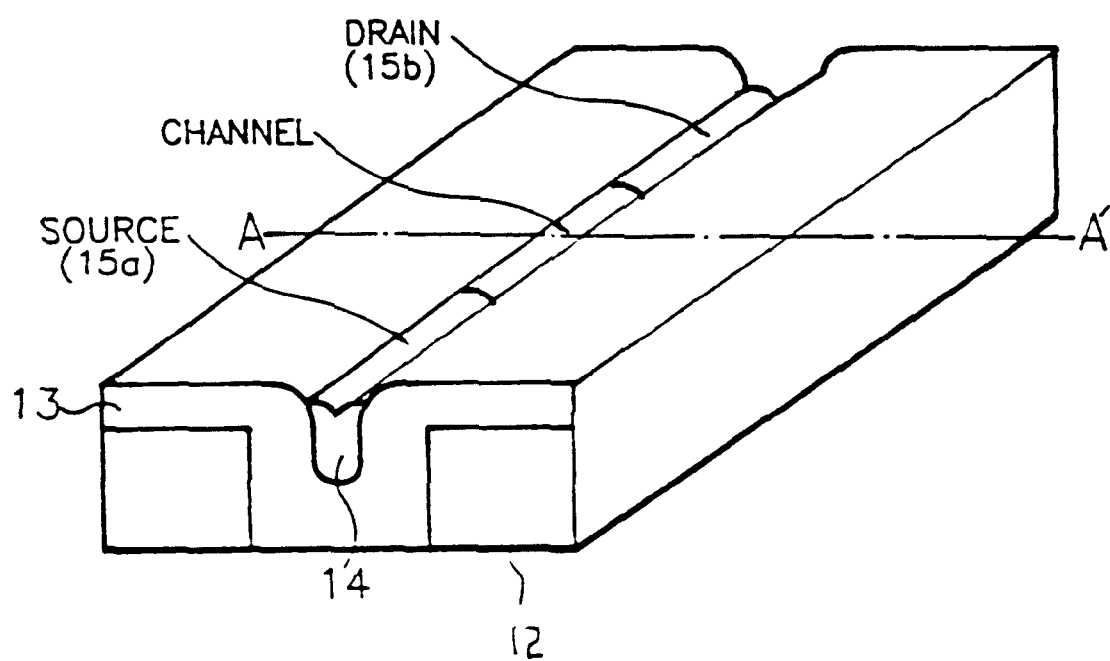
FIG. 2 is a perspective view of a thin film transistor in accordance with a first embodiment of this invention.

As shown in FIGS. 2 and 3, the structure of a thin film transistor in accordance with a first embodiment of this invention includes a gate electrode 12 formed on an insulating substrate 11. Gate electrode 12 is divided in two parts with a channel region in the middle. A gate insulation film 13 is formed on the gate electrode 12 and the insulating substrate 11. A semiconductor layer 14 which functions as an active region of the transistor is formed on the gate insulation film 13 on the channel region between the divided gate electrode 12, and source and drain impurity regions 15a and 15b respectively, formed on opposite sides of the semiconductor layer.

Figure 3A:
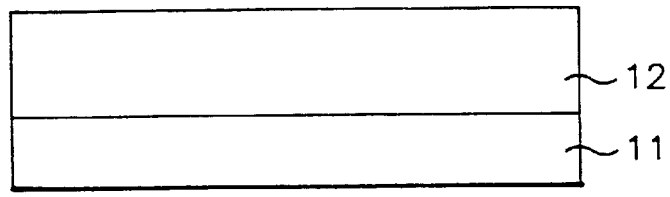
FIGS. 3(a)–3(d) are sectional views across line A-A' of FIG. 2, showing a process for fabricating a thin film transistor in accordance with the first embodiment of this invention.
Figure 3B:
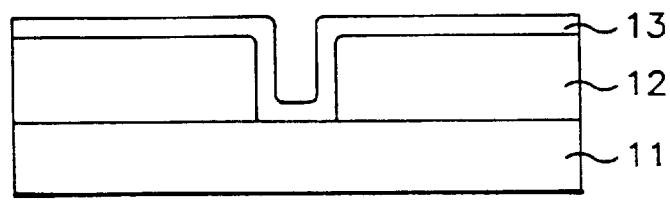

A method for fabricating the thin film transistor shown in FIG. 2 can be described with reference to FIGS. 3(a)–3(d). As shown in FIG. 3(a), a first semiconductor layer which will be used as gate electrode 12 is formed on insulating substrate 11. Then, as shown in FIG. 3(b), gate electrode 12 is divided into two parts, with a channel region in the middle being formed by selective removal of the semiconductor layer at the channel region. A gate insulation film 13 of material such as silicon oxide is formed over the surface of gate electrode 12 and substrate 11 at the channel region. In this transistor, the gate insulation film 13 is formed relatively thin so that the channel region is not fully filled, but rather forms a groove.

Figure 3C:
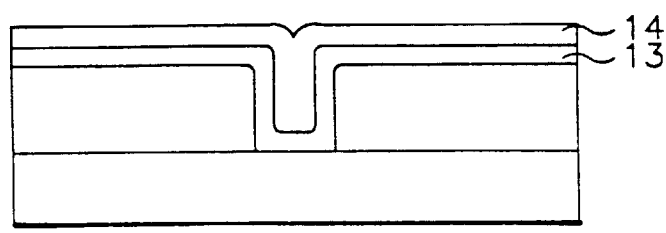
Figure 3D:
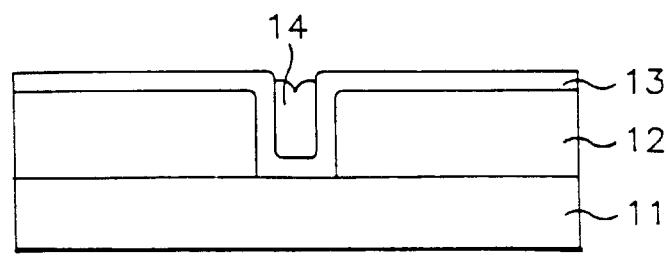

As shown in FIG. 3(c), a semiconductor layer 14 of material such as polysilicon is deposited over the entire surface of the gate insulation film 13. As shown in FIG. 3(d), the semiconductor layer 14 is then etched back so portions of the semiconductor layer remain only in the groove on the gate insulation film 13. Source and drain impurity regions 15a and 15b, respectively (FIG. 2), are formed by injecting impurity ions ($P^+$) on both opposite sides of the semiconductor layer 14 to complete the thin film transistor in accordance with the first embodiment of this invention.

Figure 4:
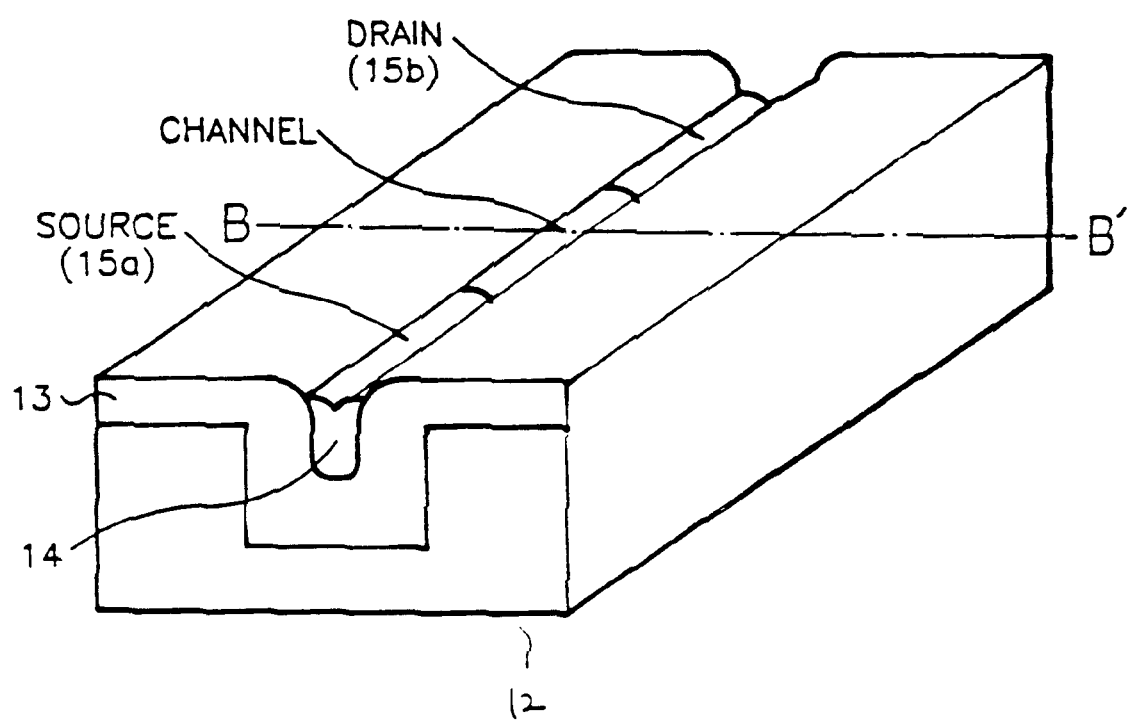
FIG. 4 is a perspective view of a thin film transistor in accordance with a second embodiment of this invention.

As shown in FIGS. 4 and 5, the structure of a thin film transistor in accordance with a second embodiment of this invention includes a gate electrode 12 and a gate insulation film 13 formed successively on an insulating substrate 11. Substrate 11 has a trench formed therein so as to form a step, i.e., to have a valley, at the trench area. A semiconductor layer 14 which functions as an active region of the transistor is formed on the gate insulation film 13 and fills the valley of the trench. Source and drain impurity regions 15a and 15b, respectively, are formed on both opposite sides of the semiconductor layer 14.

Figure 5A:
FIGS. 5(a)–5(d) are sectional views across line B-B' of FIG. 4, showing a process for fabricating a thin film transistor in accordance with the second embodiment of this invention.

A method for fabricating the thin film transistor shown in FIG. 4 can be described with reference to FIGS. 5(a)–5(d). As shown in FIG. 5(a), a trench is formed in the substrate 11 by defining a channel region of the transistor and etching the defined channel region to a predetermined depth. In this embodiment, the etch depth of the trench should be great enough to form a step at the portion of the trench where the gate electrode 12 and a gate insulation film 13 are to be formed by the process described below.

Figure 5B:
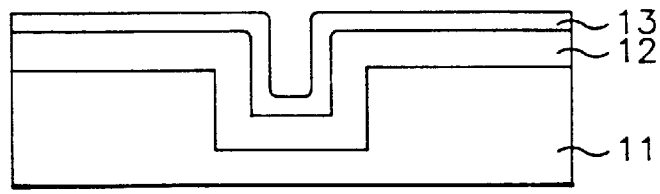
Figure 5C:
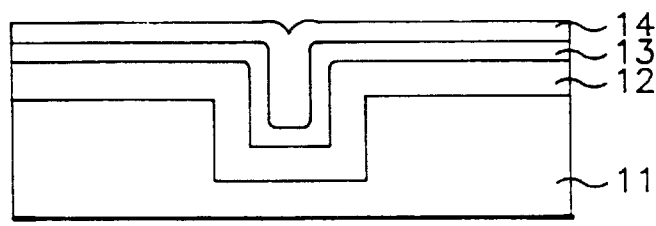

As shown in FIG. 5(b), the gate electrode 12 and the gate insulation film 13 are formed successively over the entire surface of the insulating substrate 11 having the trench formed therein. Then, as shown in FIG. 5(c), a semiconductor layer 14 of material such as polysilicon is formed on the gate insulation film 13. The semiconductor layer 14 is deposited to a thickness great enough to fully fill the valley of the trench area and provide a generally flat surface on the semiconductor layer.

Figure 5D:
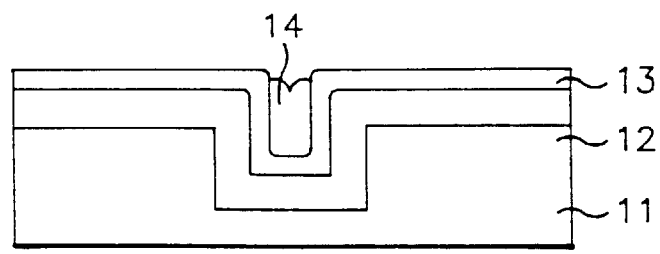

As shown in FIG. 5(d), the semiconductor layer 14 is etched to leave the semiconductor layer 14 remaining only in the valley of the trench area. Then, as shown in FIG. 4, source and drain impurity regions 15a and 15b, respectively, are formed by injecting impurity ions, (e.g., $P^+$), at both opposite sides of the semiconductor layer 14 to complete the thin film transistor in accordance with the second embodiment of this invention.

The thin film transistor structure and fabrication method of the present invention offers a number of advantages. First, since the structure of this invention has a channel region enclosed by the gate electrode, leakage current can be reduced due to uniform distribution of the electric field over the channel. SRAM memory element characteristics are thereby improved due to an increase of the on current. Second, the process for forming the channel region is simplified because the channel width can be adjusted according to the step of the gate electrode.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a thin film transistor, comprising:

providing an insulating substrate;

forming a gate electrode on the insulating substrate, said gate electrode being formed so as to be divided in two parts separated by a fixed width trench having a bottom and sidewalls that are substantially parallel to the gate electrode;

forming a gate insulation film over the surfaces of the gate electrode and the insulating substrate, said gate insulation film being formed so as to have a groove at the divided part of the gate electrode;

forming a semiconductor layer on the gate insulation film adjacent at least a portion of the groove; and forming source and drain impurity regions by selective injection of impurity ions into opposite sides of the semiconductor layer.

2. A method for fabricating a thin film transistor, comprising:

providing an insulating substrate:

forming a fixed width trench in the insulating substrate by etching, wherein the fixed width trench has a bottom and sidewalls;

forming a gate electrode and a gate insulation film successively on the insulating substrate so as to have a groove and so that the bottom and sidewalls of the fixed width trench are substantially parallel to the gate electrode;

forming a semiconductor layer on the gate insulation film in the groove; and forming source and drain impurity regions by selective injection of impurity ions into opposite sides of the semiconductor layer.

3. A method of fabricating a thin film transistor, comprising:

etching an insulating substrate to form a trench having a bottom and sidewalls;

forming a gate electrode with a first groove in the trench so that the first groove and the gate electrode extend parallel to one another along the bottom and sidewalls of the trench;

depositing a gate insulating layer over a surface of the gate electrode so as to form a second groove that extends parallel to the sidewalls and bottom of the trench and the first groove;

depositing a semiconductor layer in the second groove of the gate insulation layer; and forming source and drain impurity regions by selective injection of impurity ions into opposite sides of the semiconductor layer such that the source and drain regions are contained in the second groove.

* * * * *